United States Patent [19]
Aldrich et al.

[11] Patent Number: 5,382,850
[45] Date of Patent: Jan. 17, 1995

[54] SELECTABLE TIMING DELAY SYSTEM

[75] Inventors: Greg Aldrich, San Jose; Stephen S. Si, Sunnyvale; Eugene Wang, Fremont, all of Calif.

[73] Assignee: Amdahl Corporation, Sunnyvale, Calif.

[21] Appl. No.: 949,718

[22] Filed: Sep. 23, 1992

[51] Int. Cl.⁶ .................. H03K 5/159; H03K 7/00; H01L 25/00; H04L 7/00
[52] U.S. Cl. .................. 327/161; 375/106; 375/118; 327/141; 327/276; 327/277; 327/292; 327/564; 327/565
[58] Field of Search ............ 307/595, 603, 303, 303.1, 307/591, 602, 605, 606, 304; 328/55, 66, 63, 72; 375/106, 118

[56]   References Cited
U.S. PATENT DOCUMENTS

| | | | |
|---|---|---|---|
| 4,165,490 | 8/1979 | Howe, Jr. et al. | 328/63 |
| 4,714,924 | 12/1987 | Ketzler | 307/595 |
| 4,755,704 | 7/1988 | Flora et al. | 307/606 |
| 4,805,195 | 2/1989 | Keegan | 328/63 |
| 4,859,954 | 8/1989 | Yoshimura | 307/602 |
| 5,013,944 | 5/1991 | Fischer et al. | 307/603 |
| 5,065,041 | 11/1991 | Moles | 307/603 |
| 5,237,224 | 8/1993 | DeLisle et al. | 307/603 |
| 5,258,660 | 11/1993 | Nelson et al. | 307/602 |
| 5,280,195 | 1/1994 | Goto et al. | 307/602 |

Primary Examiner—Timothy P. Callahan
Assistant Examiner—Trong Phan
Attorney, Agent, or Firm—Fliesler, Dubb, Meyer & Lovejoy

[57]   ABSTRACT

A selectable timing delay system which provides for delaying an input signal a specified length of time within a specified tolerance wherein the range and resolution of the selectable timing delay system are so specified that the selected delay within the selected tolerance is obtainable regardless of the relative speed of the integrated circuit chips used in forming the selectable timing delay system.

2 Claims, 2 Drawing Sheets

SELECTABLE TIMING DELAY SYSTEM

BACKGROUND

1. Field of the Invention

The present invention relates to selectable programmable timing delay circuits to provide a synchronous clock signal to a number of remote modules in a synchronous system.

2. Description of the Related Art

In a synchronous system a clock signal is provided to all parts of the system which is synchronized, or delivered in phase, with a minimum margin of error. The propagation of the clock signal to various parts of the system will cause the phase of the clock due to the propagation delays in the communication link among the various parts of the system to skew. When the parts of the system are located on modules which are remote from the clock which generates the clock signal, the propagation delay can be significant, leading to an unacceptable skew in the clock signal at various modules and can cause system malfunctions. Thus, the propagation delay in the communication link which transmits the clock signal must be equalized in order to provide the synchronous clock necessary for running the system.

U.S. Pat. 4,805,195 entitled "Selectable Timing Delay Circuit" provides a selectable or programmable timing delay circuit which allows the clock signal to be synchronized at remote modules in a given system, without powering down the system and without requiring manual soldering or other cumbersome techniques during the set up of the machine.

One use of such a selectable tuning delay circuit is to have a selectable tuning delay circuit manufactured as an integrated circuit and placed on a board with other integrated chips to form a selectable delay timing system. Such a system is shown in FIG. 1 wherein the clock is received at input 11 of board 10. The board is comprised of chips 12, 13 and 14 wherein chip 13 contains the integrated circuit for the tuning delay circuit. The output, point 15, provides a delayed clock. The delay of the clock from input point 11 to output point 15 is specified as a specific delay (Ts) plus or minus a tolerance delay (ts). Since board 10 is to be manufactured in quantity, the tuning delay circuit 12 must be designed to account for the process variations of the various chips used on the board. In FIG. 1, the process variations of chip 12, chip 13 and chip 14 must be taken into account to ensure that the tuning delay circuit chip 13 has sufficient range (Tr) and resolution (tr) to meet the requirements of the specified delay (Ts) and the delay tolerance (ts).

Each chip that is manufactured has a specified nominal delay (N) and an absolute process variation (V) for the delay to take into account the varying speed of chips, of the same type, manufactured by the manufacturer. The problem is exemplified in FIG. 2. The delay associated with a board would have a minimum nominal delay, obtained by having the tuning delay circuit set at its minimum delay, and a nominal maximum delay, obtained by setting the tuning delay circuit to its maximum delay. The range between the minimum nominal delay and the maximum nominal delay would be the tuning range of the timing delay circuit on the board. When process variations are taken into account, FIG. 2 illustrates that fast chips will result in a minimum and maximum delay which occurs earlier than if nominal values were used and that slow chips will result in minimum and maximum delays which occur later in time than had nominal chips been used.

In that when the board is manufactured, it is unknown what the characteristics of the chips used on the board will be, the problem arises to design a tuning delay circuit capable of tuning the system to obtain the desired specified delay within the specified tolerances.

SUMMARY OF THE INVENTION

Accordingly, it is an object of the present invention to provide a timing delay system which accounts for the process variations of the component integrated circuit chips used within the system such that the system will have sufficient range and resolution to tune the timing delay system to a specified timing delay within the tolerances associated with the specified timing delay.

Referring to FIG. 2, the effective timing delay range (Tr) of the system would be the length of time between point A, the minimum slow delay (Tmin) obtained with the tuning delay circuit set for a minimum delay, and point B, the maximum fast delay (Tmax) obtained with the tuning delay circuit set for a maximum delay. The range A–B is the tunable range of the timing delay system which would allow the timing delay system to adjust for a delay between point A and point B regardless of whether the chips used were fast or slow or any combination of being fast or slow. The timing delay circuit is therefore required to have sufficient delay capability to allow the system delay represented by point A to be less than the specified delay and the system delay represented by point B to be greater than the specified system delay.

The resolution (tr) of the tuning delay system is defined as the length of time between the last fine delay setting of the system and the next course delay setting of the system. The tuning resolution of the tuning delay circuit within the tuning delay system must be equal to or less than the magnitude of the tolerances associated with the specified delay (2ts).

A tuning delay system meeting the requirements for range (Tr) and resolution (tr) will allow the system to be adjusted to a specified delay (Ts) with a tolerance (ts) regardless of the speed of the various integrated circuit chips used within the system. Such a designed tuning delay system thereby allows the mass production of the tuning delay system where the tuning delay system will have the range and resolution necessary to allow the tuning delay system to be adjusted to the specified tuning delay within the tolerances of the tuning delay.

BRIEF DESCRIPTION OF THE DRAWINGS

The invention will be described with respect to the particular embodiments thereof and reference will be made to the drawings, in which.

DETAILED DESCRIPTION OF THE PREFERRED EMBODIMENTS

Figure 4:
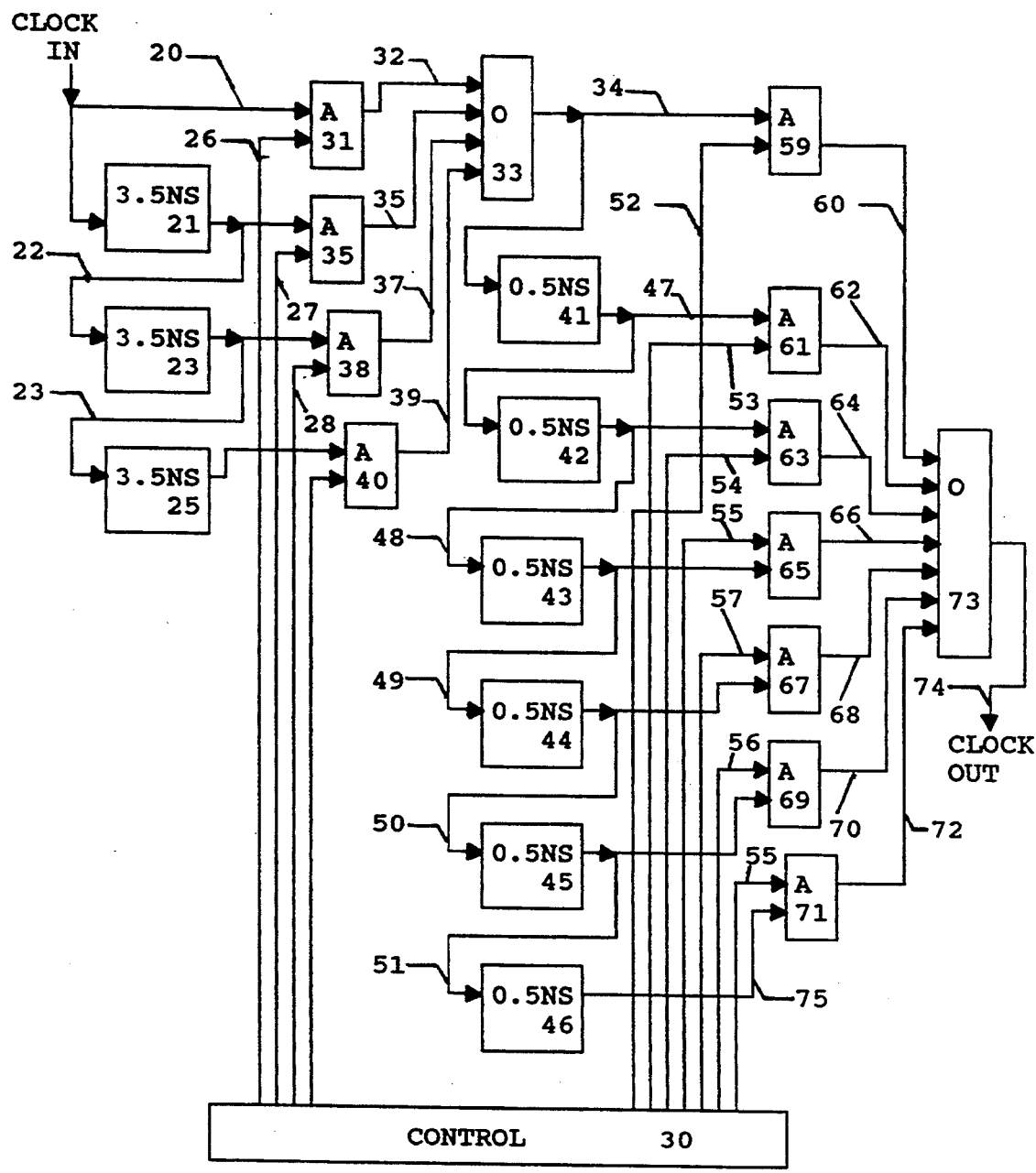
FIG. 4 is a logic diagram showing the timing delay circuit of the timing delay system.

FIG. 4 shows a tuning delay circuit comprised of three rough tuning steps of 3.5 ns and six fine tuning steps of 0.5 ns. It should be understood that the number of rough tuning steps and fine tuning steps are determined such that the tuning delay circuit will provide the tuning delay system with the desired range (Tr) and resolution (tr).

The clock is connected to AND 31 and delay 21 via line 20. The output of delay 21 is connected to AND 36 and delay 23 via line 22. The output of delay 23 is connected to AND 38 and delay 25 via line 24. The output of delay 25 is connected to AND 40 via line 76. The outputs of AND 31 on line 32, AND 36 on line 35, AND 38 on line 37 and AND 40 on line 39 are connected to OR 33. The output of OR 33 is connected via line 34 to AND 59 and delay 41. The output of delay 41 is connected via line 47 to AND 61 and delay 42. The output of delay 42 is connected via line 48 to AND 63 and delay 43. The output of delay 43 is connected via line 49 to AND 65 and delay 44. The output of delay 44 is connected via line 50 to AND 67 and delay 45. The output of delay 45 is connected via line 51 to AND 69 and delay 46. The output of delay 46 is connected via line 75 to AND 71. The outputs of AND 59 on line 60, AND 61 on line 62, AND 63 on line 64, AND 65 on line 66, AND 67 on line 68, AND 69 on line 70, and AND 71 on line 72 are all connected to OR circuit 73. The output of OR circuit 73 is the clock out signal on line 74. Control 30 is connected to AND 31 via line 26, AND 36 via line 27, AND 38 via line 28, AND 40 via line 29, AND 59 via line 52, AND 61 via line 53, AND 63 via line 54, AND 65 via line 58, AND 67 via line 57, AND 69 via line 56, and AND 71 via line 55. Control 30 sets the desired level of delay within the circuit by activating one rough tuning AND circuit 31, 36, 38 or 40 and one fine tuning AND circuit 59, 61, 63, 65, 67, 69 or 71. The tunable circuit delay of the delay tuning circuit of FIG. 4 is 0 ns to 13.5 ns in steps of 0.5 ns.

The manufacturer of integrated circuit chips provides information as to the nominal delay, the absolute process variation and the on chip process variation of integrated circuit chips manufactured by that manufacturer. The nominal delay (N) is defined as the delay of a signal processed by an integrated circuit chip. The absolute process variation (V) is defined as the variation in the nominal delay (N) for integrated circuit chips of the same type. The manufacturer also supplies the value for the on chip process variation (D) which is defined as the variation of the delay for different paths having the same delay within the same integrated circuit chip.

The tuning range (Tr) of the tunable timing delay system is the difference between the maximum delay (Tmax) and the minimum delay (Tmin) when taking into account the process variations of all the chips within the system and the maximum and minimum settings of the tunable delay circuit.

Figure 1:
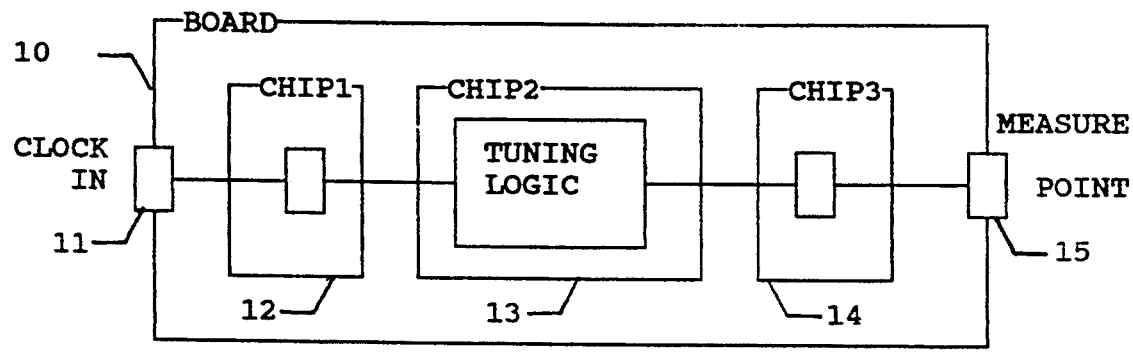
FIG. 1 is a diagram showing the selectable timing delay system being comprised of a plurality of integrated circuit chips wherein one of the integrated circuit chips is a tunable delay circuit.
Figure 2:
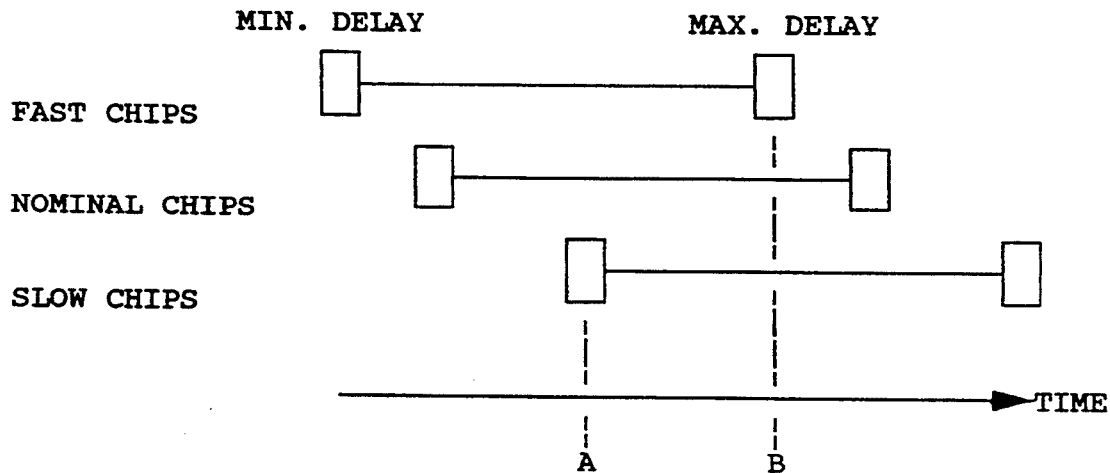
FIG. 2 is a diagram showing the relationship between nominal, fast and slow chips and defines the effective range of a timing delay system employing integrated circuit chips having those process variation parameters.

The method for defining the tuning range (Tr) of a tunable timing delay system can best be described by way of example. First assume that we have the tunable timing delay system of FIG. 1 comprising three chips, 12, 13 and 14. Further assume that chip 13 contains the timing delay circuit of FIG. 4. Further assume that chip 12 has a nominal delay N1 of 1 ns and an absolute process variation V1 of 30%. Further assume that chip 14 has a nominal delay N3 of 2 ns and an absolute process variation V3 of 40%. Further assume that chip 13, the tuning delay circuit, has a process variation V2 of 50% and an on chip process variation D2 of plus or minus 15%. The nominal delay of associated with chip 13 will be determined by making an analysis of the minimum and maximum delay for the chip. Finally assume that the logic gates used in the tunable delay circuit of FIG. 4 have a 0.4 ns delay associated with each of them.

Referring to FIG. 4, if control 30 selects the minimum path through the timing delay circuit, that path will be line 20 to AND 31, line 32 to OR 33, line 34 to AND 59, line 60 to OR 73 and, finally, line 74. Four gates are used in the path resulting in a minimum nominal delay N2 min of 1.6 ns. By observation of FIG. 4, four gates will be used for each path selected by control 30.

The maximum nominal delay N2 max of the timing delay circuit is the summation of delay elements, 21, 23, 25, 41, 42, 43, 44, 45 and 46, plus the delay of the four gates 40, 33, 71 and 73 resulting in a maximum timing delay of 15.1 ns.

The maximum timing delay, Tmax, is expressed as:

$$Tmax = N1*(1-V1) + N3*(1-V3) + N2max*(1-V2) \quad (1)$$

The minimum timing delay, Tmin, is expressed as:

$$Tmin = N1*(1+V1) + N3*(1+V3) + N2min*(1+V2) \quad (2)$$

The summation of the delays associated with the integrated circuit chips to obtain the maximum delay Tmax and minimum delay Tmin can be either a straight arithmetic summation as shown in Equations 1 and 2, or a statistical summation as shown in Equations 3 and 4.

$$Tmax = N1 + N3 + N2max - ((N1*V1)^2 + (N3*V3)^2 + (N2max*V2)^2)^{\frac{1}{2}} \quad (3)$$

$$Tmin = N1 + N3 + N2min + ((N1*V1)^2 + (N3*V3)^2 + (N2min*V2)^2)^{\frac{1}{2}} \quad (4)$$

Using the figures in this example and Equations 1 and 2, Tmax equals 9.45 ns and Tmin equals 6.5 ns. Using the statistical arithmetic sum as expressed by Equations 3 and 4, Tmax equals 10.5 ns and Tmin equals 5.77 ns.

The worst case analysis for Tmax and Tmin is expressed by Equations 1 and 2 and the less stringent statistical analysis for Tmax and Tmin is expressed by Equations 3 and 4.

For a required selected delay Ts, the first critical criterion that the selectable timing delay system must meet, to operate properly regardless of the speed of the various chip making up the system, is:

$$Tmin \leq Ts \leq Tmax \quad (5)$$

Figure 3:
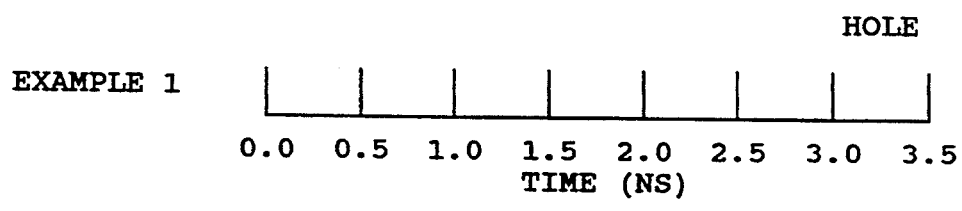
FIG. 3 is a diagram providing two examples of the resolution of the timing delay circuit within the timing delay system.
Figure 3:
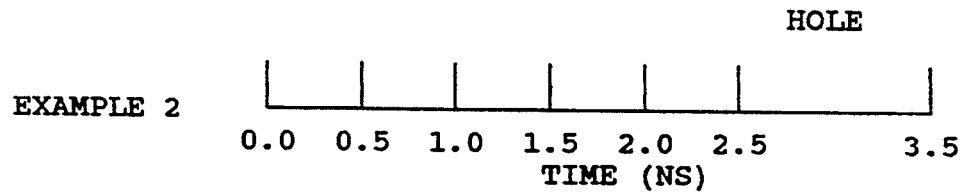

However, even if the criteria of Equation 5 are met, there is no assurance that the timing delay system can actually be tuned for the specified delay Ts within the specified delay tolerances ts. The problem is exemplified by FIG. 3. Example 1 of FIG. 3 shows a timing delay system which has six fine tuning steps Tf of 0.5 ns per step and course tuning steps Tc of 3.5 ns. Since the system can only be set to the discrete values shown in Example 1, the resolution of the timing delay system would be 0.5 ns, the size of a discrete fine tuning step Tf. For example, if the specified delay was 2.7 ns with a tolerance of ±0.1 ns, the criteria of Equation 5 would have been met. However, due to the discrete jumps between fine tuning steps, the system would not have sufficient resolution to be able to delay the clock by the required 2.7 ns within a tolerance range of ±0.1 ns or from 2.6 ns to 2.8 ns. The timing delay system resolution tr requires the size of the fine tuning step Tf to be equal to or less than the magnitude of the tolerance associated with the selected delay. In Example 1 the timing delay system has a resolution tr of 0.5 ns which means that the system will be able to meet the requirements of any selected delay Ts if the tolerance ts specified is 0.25 ns. Since the tolerance is specified as plus or minus, the magnitude of the tolerance is 2 ts or 0.5 ns. Once again, the process variation must be taken into account in specifying the fine timing step Tf of the timing delay system. The tuning delay circuit defines the parameters of the fine timing step Tf and, therefore, the process variation associated with the tuning delay circuit chip is used in calculating the worst case analysis of a fine tuning step Tf.

For a given selected delay Ts having a tolerance ts, the second critical criteria for the timing delay system, such that the timing delay system may be adjusted to the selected delay within the tolerance set forth for the selected delay regardless of the speed of the various integrated circuit chips used within the system, is:

$$Tf^*(1+V) \leq 2^*ts \tag{6}$$

The timing delay circuit has fine and course tuning steps where the fine tuning steps fill in between the course steps. While the timing difference between fine tuning steps will be the same with a given system, the question arises as to the timing difference between the last fine tuning step and the next course tuning step. A hole is defined as the difference between a course tuning step Tc and the summation of the fine tuning steps Tfs. Both process variation V and on chip process variation D are used in determining the size of the hole. Again, the hole is calculated for fast chips Hf and for slow chips Hs. The equation for a hole having fast chips is:

$$Hf = Tc^*(1-V+2D) - Tfs^*(1-V) \tag{7}$$

The equation for a hole having slow chips is:

$$Hs = Tc^*(1+V) - Tfs^*(1+V-2D) \tag{8}$$

For a specified delay Ts having a tolerance ts, the third critical criteria is that the system resolution meet the requirement that both the fast hole size Hf and the slow hole size Hs be less than or equal to the absolute tolerance associated with the specified delay.

Using the values of the example, the time associated for a fine step Tf*(1+V) is 0.75 ns, for the hole for fast chips Hf is 1.3 ns and for the time hole for slow chips Hs is 1.65 ns.

The resolution tr of the timing delay system is the maximum value of the fine step Tf*(1+V), the hole for fast chips Hf or the hole for slow chips Hs.

$$tr = MAX(Tf^*(1+V), Hf, Hs) \leq 2^*ts \tag{9}$$

The foregoing has been a discussion of the relationship between a specified delay having a specified tolerance and the requirements of a selectable timing delay system necessary to meet the requirements of the specified delay and with its specified tolerances. By using the three critical criteria for the selectable timing delay system, the system may be adjusted to the selected delay with its accompanying tolerances without further regard to whether the integrated circuit chips making up the selectable timing delay system are fast or slow or any combination thereof.

While the invention has been particularly shown and described with reference to the preferred embodiment therefore, it will be understood by those skilled in the art that changes in form and detail may be made therein without departing from the spirit and scope of the invention. Given the above disclosure of general concepts and specific embodiments, the scope of the protection sought is defined by the following claims.

What is claimed is:

1. A clock tuning system of integrated circuit chips for receiving a clock and providing a delayed clock at a specified point within said system where said clock is delayed a specified delay of Ts within a tolerance of ± ts from a clock reference point outside of said system, the manufacturer of each said chip specifying a nominal delay of N, an absolute process variation of V and a chip process variation of D such that each said chip has a delay within the range of N*(1−V) to N*(1+V), said system comprising:

a plurality of integrated circuit chips connected in series for providing a path for said clock from said reference point to said specified point, said path having a delay in the range of Tmin to Tmax such that Tmin ≦ Ts ≦ Tmax where Tmin is the sum of said minimum delay for each said chip in said system and Tmax is the sum of said maximum delay for each said chip in said system; and a tuning apparatus within one of said chips for providing a tuned clock which will cause said delayed clock at said specified point in said system to be said clock delayed by a delay within a range of (Ts−ts) to (Ts+ts), said chip containing said tuning apparatus having a minimum delay of Nmin*(1+V) where Nmin is the nominal delay with said tuning apparatus set to a minimum delay and a maximum delay of Nmax*(1−V) where Nmax is the nominal delay with said tuning apparatus set to a maximum delay, said tuning apparatus comprising;

n course delay means connected in series for receiving and delaying said clock where each said course delay means provides a course delayed clock and has a delay within the range of Tc*(1−V+2D) to Tc*(1+V) where Tc is the nominal delay of said course delay means;

course selection means receiving said clock and all said course delayed clocks for selectively providing a course clock of either said clock or one of said course delayed clocks;

m fine delay means connected in series for receiving and delaying said course clock, said series of fine delay means having a maximum delay within the range of m*Tf*(1−V) to m*Tf*(1+V−2D) such that m*Tf*(1+V−2D) ≦ Tc*(1−V+2D) where Tf is the nominal delay of said fine delay means, each said fine delay means providing a fine delayed clock and has a delay within the range of Tf(1−V) to Tf(1+V) such that Tf(1−V) ≦ 2*ts; and fine selection means receiving said course clock and all said fine delayed clocks for selectively providing said tuned clock of either said course selected clock or one of said fine delayed clocks.

2. The clock tuning system of claim 1 wherein said tuning apparatus has the requirements that both the value of a fast chip hold Hf where $Hf = Tc*(1-V+2D) - m*Tf*(1-V)$ and of a slow chip hold Hs where $Hs = Tc*(1+V) - Tfs*(1+V-2D)$ are $\leq 2*ts$ to provide said tuning apparatus with a resolution that allows the delay to be changed in increments of delay within the specified tolerance of $\pm ts$ for said specified delay Ts.

* * * * *